United States Patent
Ostrowicki

(10) Patent No.: US 9,496,208 B1
(45) Date of Patent: Nov. 15, 2016

(54) SEMICONDUCTOR DEVICE HAVING COMPLIANT AND CRACK-ARRESTING INTERCONNECT STRUCTURE

(71) Applicant: Texas Instruments Incorporated, Dallas, TX (US)

(72) Inventor: Gregory Thomas Ostrowicki, Rockwall, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/053,453

(22) Filed: Feb. 25, 2016

(51) Int. Cl.
*H01L 23/495* (2006.01)
*H01L 25/07* (2006.01)
*H01L 23/00* (2006.01)

(52) U.S. Cl.
CPC ... *H01L 23/49575* (2013.01); *H01L 23/49562* (2013.01); *H01L 24/32* (2013.01); *H01L 24/40* (2013.01); *H01L 24/73* (2013.01); *H01L 25/074* (2013.01); *H01L 2224/32245* (2013.01); *H01L 2224/40245* (2013.01); *H01L 2224/73213* (2013.01); *H01L 2224/73263* (2013.01); *H01L 2924/13091* (2013.01); *H01L 2924/1425* (2013.01)

(58) Field of Classification Search
CPC .......... H01L 23/49575; H01L 25/074; H01L 23/49562; H01L 24/40; H01L 24/70; H01L 24/32
See application file for complete search history.

(56) References Cited

U.S. PATENT DOCUMENTS

| | | | | |
|---|---|---|---|---|
| 7,285,849 B2* | 10/2007 | Cruz | ..................... | H01L 21/561 257/690 |
| 7,663,211 B2* | 2/2010 | Noquil | ................ | H01L 23/3107 257/675 |
| 8,373,257 B2* | 2/2013 | Shi | ......................... | H01L 21/565 257/669 |
| 8,581,376 B2* | 11/2013 | Yilmaz | ............. | H01L 23/49524 257/676 |
| 8,680,658 B2* | 3/2014 | Shi | .................... | H01L 23/49562 257/673 |
| 9,214,415 B2* | 12/2015 | Denison | .................. | H01L 24/40 |
| 2009/0212405 A1* | 8/2009 | Liu | ................... | H01L 23/49537 257/670 |

* cited by examiner

*Primary Examiner* — William Coleman
(74) *Attorney, Agent, or Firm* — Rose Alyssa Keagy; Frank D. Cimino

(57) ABSTRACT

A power converter (300) has a first transistor chip (310) conductively stacked on top of a second transistor chip (320) attached to a substrate (301). A first metallic clip (360) has a plate portion (360a) and a ridge portion (360c) bent at an angle from the plate portion. The plate portion is attached to the terminal of the first transistor chip opposite the second transistor chip. The ridge portion extends to the substrate is and is configured as a plurality of parallel straight fingers (360d). Each finger is discretely attached to the substrate using attachment material (361), for instance solder, and operable as a spring-line cantilever to accommodate, under a force lying in the plane of the substrate, elastic elongation based upon inherent material characteristics.

15 Claims, 6 Drawing Sheets

US 9,496,208 B1

SEMICONDUCTOR DEVICE HAVING COMPLIANT AND CRACK-ARRESTING INTERCONNECT STRUCTURE

FIELD

Embodiments of the invention are related in general to the field of semiconductor devices and processes, and more specifically to the structure and fabrication method of packaged semiconductor devices including metal clips configured for compliant and crack-arresting interconnects.

DESCRIPTION OF RELATED ART

In today's technology, power converters with high current handling capabilities use discrete metal oxide semiconductor (MOS) field effect transistors (FETs). Among the popular families of power switching devices are the DC-DC power supply circuits, especially the category of Switched Mode Power Supply circuits. Particularly suitable for the emerging power delivery requirements are the synchronous Buck converters with two power MOS field effect transistors (FETs) connected in series and coupled together by a common switch node. In the Buck converter, the control FET chip, also called the high side switch, is connected between the supply voltage $V_{IN}$ and the LC output filter, and the synchronous (sync) FET chip, also called the low side switch, is connected between the LC output filter and ground potential. The gates of the control FET and the sync FET are connected to a semiconductor chip including an integrated circuit (IC) acting as the driver of the converter, and the driver, in turn, is connected to a controller IC. Preferably, both ICs are integrated on a single chip, which is also connected to ground potential. The inductor of the output circuitry serves as the energy storage of the power supply circuit.

In recently introduced schemes, the control FET chip and the sync FET chip are assembled vertically on top of each other as a stack, as illustrated in the example 100 of FIG. 1A. When both the low side (LS, sync) chip 120 and the high side (HS, control) chip 110 are assembled source-down, the typically larger (both physically and active area) LS chip is assembled onto the leadframe pad 101 and the smaller (both physically and active area) HS chip has its source tied to the drain of the LS chip, forming the switch node of the converter; the drain of the HS chip is tied to the input supply $V_{IN}$.

The bottom chip 120 of the stack is assembled on the pad 101 of a leadframe, which is at ground potential and serves as a spreader of operationally generated heat. The leads of the leadframe are commonly shaped without cantilever extensions, and arranged in the manner of Quad Flat No-Lead (QFN) or Small Outline No-Lead (SON) devices. The stacked assembly is typically packaged in a plastic encapsulation 170, and the packaged components are employed as discrete building blocks for board assembly of power supply systems.

The electrical connections from the switch node and the stack top to the leads are typically provided by metal clips, which have a thickness to carry high currents, dissipate heat effectively, and introduce only a minimum of parasitic inductance into the power circuit. In FIG. 1A, the clip for the switch node is designated 140, and the top clip is designated 160. Clip 160 has a broad foot 160a for contacting a plurality of leads simultaneously using solder 161.

A cross section of the converter of FIG. 1A is shown in FIG. 1B. The control MOS field effect transistor (FET) 110 is stacked upon a synchronous (sync) MOSFET 120. A QFN metal leadframe has a rectangular flat pad 101 destined to become the heat spreader of the package; the leads 102a and 102b are positioned in line along two opposite sides of the pad. The stacking of the FET chips is accomplished by the so-called source-down configuration: The source of sync FET 120 is soldered to the leadframe pad 101 by solder layer 121. A first clip 140, soldered by solder layer 122 onto the drain of sync FET 120, has the source of control FET 110 attached by solder layer 111 and serves thus as the switch node terminal of the converter. A second clip 160 is connected by solder layer 112 to the drain of control FET 110. The broad foot 160a of the second clip 160 is attached to leadframe lead 102b by solder 161, and thus forms a broad foot for connection to the input supply $V_{IN}$.

SUMMARY

Analyzing reliability failures of synchronous Buck power converters after HAST (highly accelerated stress test) and device operations, applicant found cracks through the solder of the joints connecting copper clips and substrate (mostly copper leadframes). The root cause of the cracks turned out to be the high thermomechanical stress in the joints at the foot of the clips initiated by the stiff structure and the broad expanse of the metallic bond.

Applicant reduced the problem of cracks through the solder joint when he discovered a methodology, which combines thermomechanical stress reduction by compliant clip structure (comb-like clip design) and configurations arresting the propagation of cracks in the joints (segmented joints).

Compliant clip structures include parallel fingers at the ridge end of the clips, which can accommodate, under a force lying in the plane of the expanding and contracting substrate, elastic bending and stretching beyond the limit of simple elongation based upon inherent lead material characteristics. Fingers with elastic properties can be achieved, for example, by configurations, which may be selected from straight geometry, curved geometry, toroidal geometry, and multiple-bendings geometry.

A configuration arresting a propagating crack includes, for instance, a structure, which divides a broad continuous contact regime between clip and substrate into a plurality of discrete mini-contacts spaced by no-contact zones. In case a crack would indeed develop in one of the mini-contacts, this crack would dead-end at the next no-contact zone and could thus not continue to propagate through the total extent of the contact regime. The crack would in fact be arrested.

DETAILED DESCRIPTION OF THE PREFERRED EMBODIMENTS

Figure 1A:
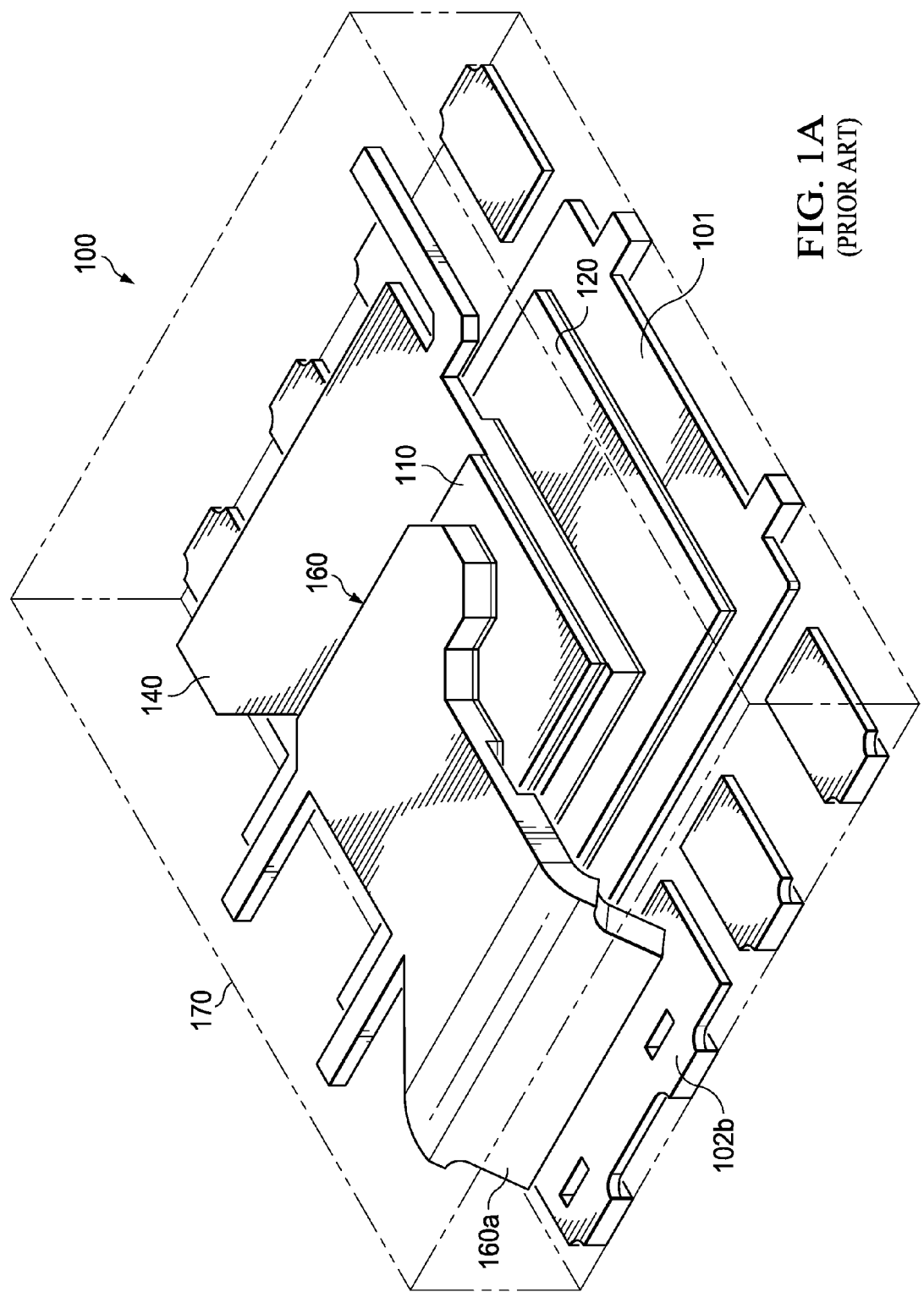
FIG. 1A shows a perspective view of a power converter assembled according to prior art; the top clip has a broad foot with a continuous edge for attachment to the leadframe.
Figure 1B:
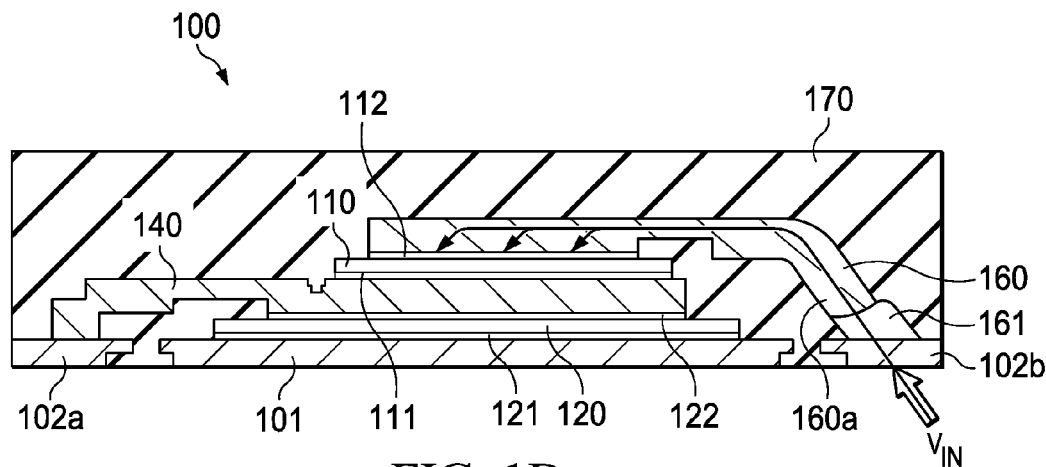
FIG. 1B illustrates a cross section of the power converter of FIG. 1A, assembled according to prior art with a large-area sync FET chip attached to a leadframe pad and topped by a small-area control FET chip; the clip contacting the control FET is connected to a lead by an elongated clip with a broad continuous foot.
Figure 2:
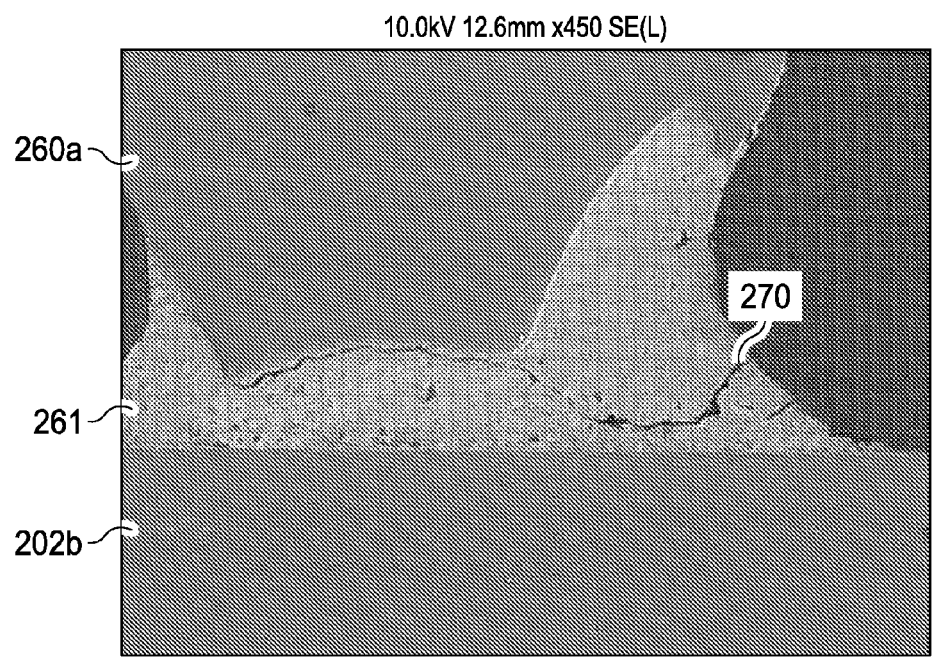
FIG. 2 depicts a scanning electron micrograph (magnification 300×) of a cross section of a failed joint between a clip foot and a lead; the crack in the solder extends across the whole joint.

When applicant analyzed failures of conventional power converters, especially failures in highly accelerated stress tests (HAST), he observed frequently cracks of the screen-printed solder joints between the top clip and the leads. FIG. 2 illustrates a SEM (scanning electron micrograph, magnification 300×) of the cross section of such failed joint. The metal portion designated 260a is a portion of the foot of the converter top clip, 202b is the broad lead, and 261 is the solder. The long crack is indicated by two arrows 270; the crack is continuous and extends through the whole joint, causing an electrical open and thus a disconnect to the input voltage $V_{IN}$.

A crack like 270 starts as a microcrack caused by thermomechanical stress and propagates rapidly, especially in the presence of moisture. According to the Griffith energy-balance concept for crack formation in solids, a change in the length of a nascent crack or notch cannot change the sum of all energies; in other words, the sum of surface energy and mechanical energy has to stay constant. This means for a crack extension that the surface energy may generally increase, but the mechanical energy has to decrease. The mechanical energy itself consists of the sum of the strain potential energy stored in the material and the potential energy of the outer applied loading system. This says, whenever any of these energies can assume a lower value, the freed energy can be invested in generating more surface for an expanding crack.

Applying the Griffith equilibrium requirement to solder joints in semiconductor assemblies, whenever uniform stress is applied (for instance during operation or testing of the semiconductor device) so that it is larger than the failure stress, a nascent crack may propagate spontaneously and without limit—unless it is stopped or arrested. The failure stress at the crack front, in turn, is proportional to the free surface energy per unit area and to Young's modulus (a material constant), and inverse proportional to the length of the starter crack or notch. A methodology for avoiding the formation of microcracks and the propagation of cracks is offered by the two-prong approach of the invention.

Figure 3A:
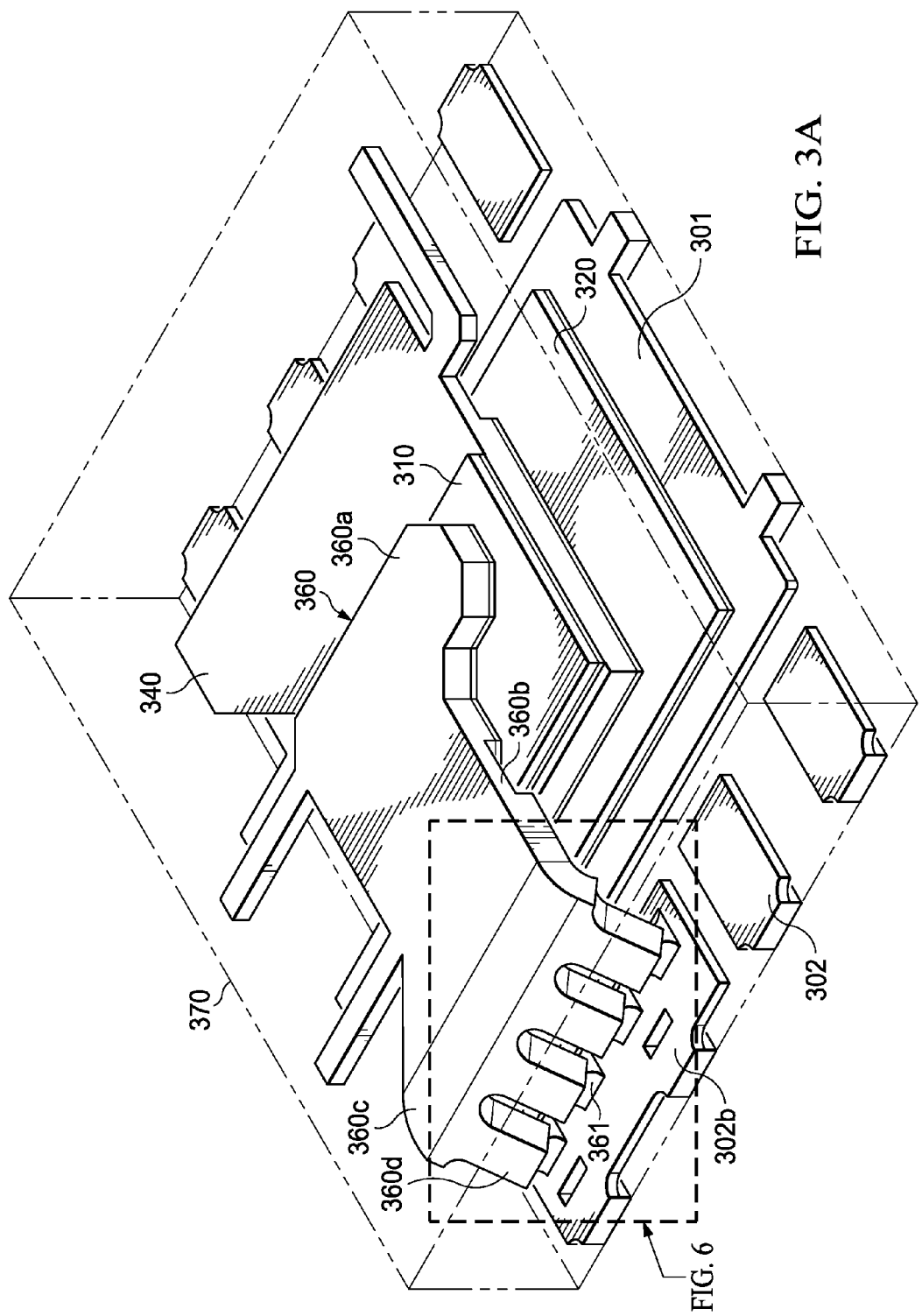
FIG. 3A shows a perspective view of an embodiment of the invention, a power converter using a top clip with a ridge having a foot structured as an array of parallel fingers.

FIG. 3A illustrates an exemplary power converter 300 as an embodiment of the invention. The high side (HS, control) MOSFET chip 310 and the low side (LS, sync) MOSFET chip 320 are assembled source-down vertically on top of each other as a stack. The bottom LS chip 320 of the stack is attached (preferably by solder) to the leadframe pad 301, which is at ground potential and serves as a spreader of operationally generated heat. The top HS chip has its source tied to the drain of the LS chip, forming the switch node of the converter; the drain of the HS chip is tied to the input supply $V_{IN}$.

In other embodiments, however, the sync chip may be stacked on top of the control chip, in a drain-down configuration. Bipolar transistors can also substitute for the MOSFETs in similar constructions.

The leads 302 of the leadframe are shaped without cantilever extensions and arranged in the manner of Quad Flat No-Lead (QFN) or Small Outline No-Lead (SON) devices. The leadframe is stamped or etched from a base sheet metal selected from, but not limited to, copper, copper alloy, aluminum, iron-nickel alloy, or Kovar™; preferred thicknesses of the base material are from about 0.15 to 0.25 mm. The stacked assembly is typically packaged in a plastic encapsulation 370. For clarity reasons, the encapsulation 370 in FIG. 3 is illustrated as transparent, while in reality, packaging materials are opaque and preferably black colored.

The electrical connections from the switch node and the stack top to the leads are provided by metal clips. The exemplary converter of FIG. 3A has two metal clips 340 and 360 for electrical connections. The clips have preferably a thickness of about 250 μm, suitable for carrying high currents, dissipating heat effectively, and introducing only a minimum of parasitic inductance into the power circuit. The clips are preferably made of copper or a copper alloy. In the source-down assembly configuration, clip 340 is the switch connector, coupling the source of control chip 310 with the drain of sync chip 320. Clip 360 is the connector of the connector of the control chip to $V_{IN}$.

The configuration of clip 360 includes a plate 360a, an extension 360b and a ridge or foot 360c. Plate 360a and extension 360b are parallel to leadframe pad 301 and spaced from leadframe pad 301 by a height to accommodate the thicknesses of control chip 310, sync chip 320, switch node clip 340, and the solder layers employed for attachment. In total, this height may be about 500 μm. Ridge 360c is bent from plate 360a by an angle so that it stretches across the height and can be soldered onto leads 302b in order to connect to the input supply $V_{IN}$.

A preferred fabrication method for clips 340 and 360 may involve a half-etch technique, which allows the formation of a beam-like ridge 360b protruding from one side of clip 360 to facilitate the attachment of clip 360 to lead 302b of the leadframe. Alternatively, the clips may be fabricated by a stamping and coining technique.

As FIG. 3A shows, the ridge or foot 360c is interdigitated in a plurality of parallel fingers 360d. The contacts of the fingers 360d to the broad lead 302b are preferably established by solder connections 361. As pointed out below, the solder connections 361 are preferably kept as discrete connection islands so that a continuous common solder band is avoided.

In the exemplary embodiment of FIG. 3A, the parallel fingers 360d of top clip 360 are formed as a comb with relatively short fingers. In another embodiment depicted in FIG. 3B, parallel fingers 360e are formed with a length stretching across a major portion or all of ridge (or foot) 360c. The technical advantage offered by fingers and especially elongated fingers is schematically shown in FIG. 4.

In operation or in reliability testing, power converters are subjected to wide and abrupt temperature swings, which cause significant thermomechanical stresses in the assembled converter due to widely different coefficients of thermal expansion between the silicon-based chips and the materials of the leadframe, clips and package. The brittle solder joints connecting these assembly parts have to withstand these stresses without forming microcracks. The solder joints can be protected against stress-induced failures, when parts of the assembly exhibit enough flexibility and compliance. As an example, fingers with the characteristics of elastic cantilever can act as stress-absorbing compliant barriers between the silicon-based chips and the other parts of the device.

Figure 3B:
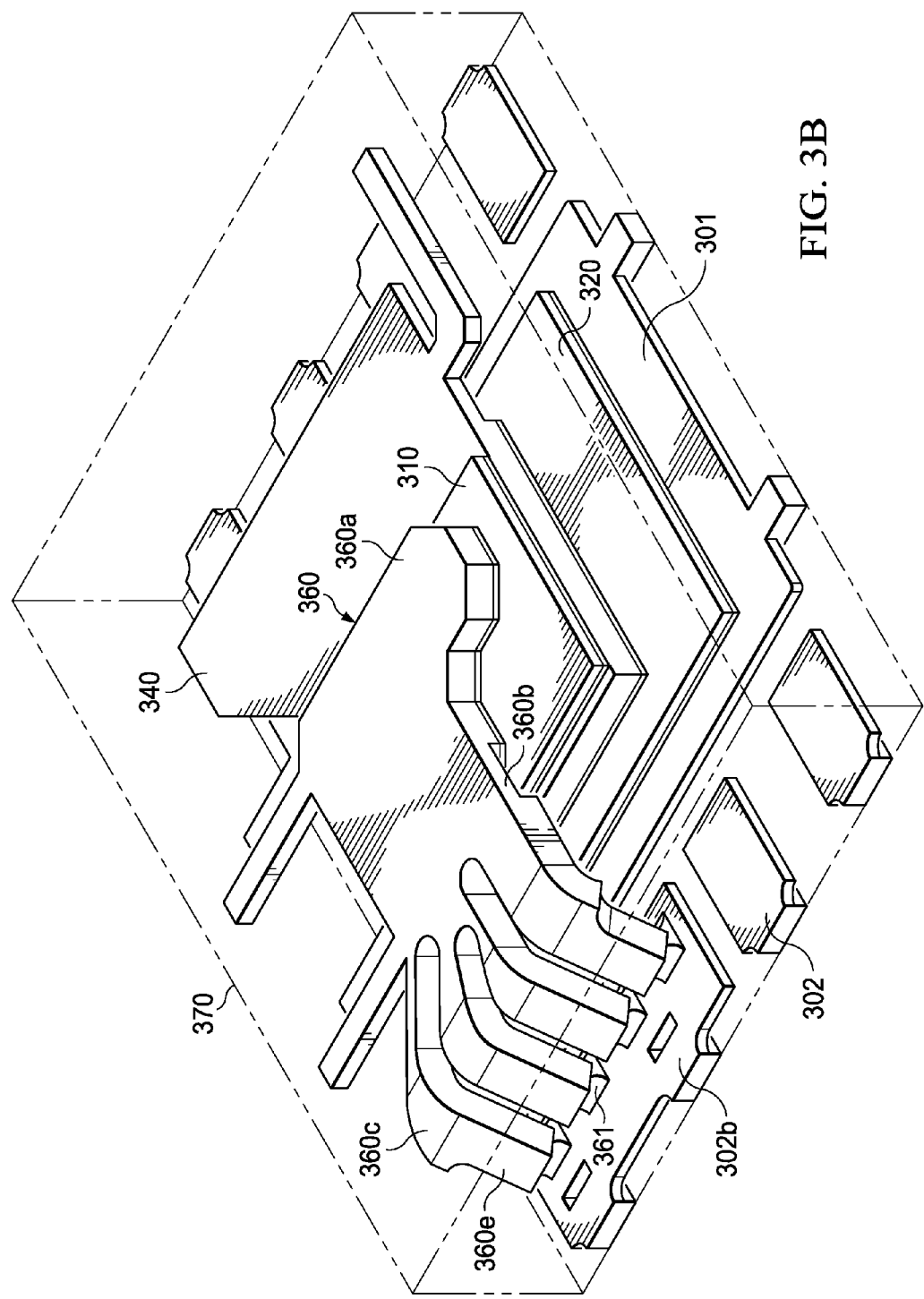
FIG. 3B illustrates a perspective view of another embodiment of the invention, a power converter using a top clip with a ridge having a foot structured as an array of long, straight and parallel fingers.
Figure 4:
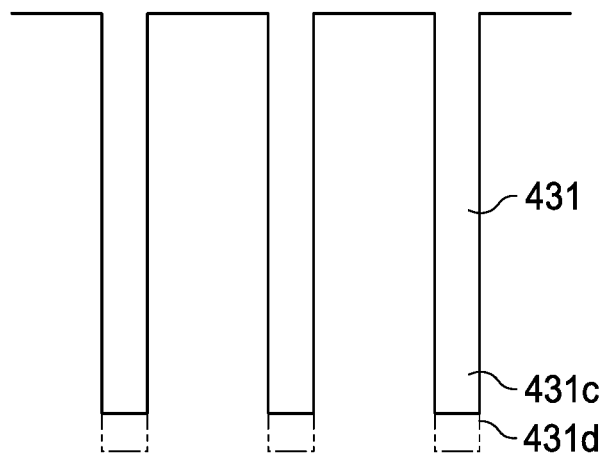
FIG. 4 depicts an example of a geometry for the ridge fingers of a clip, which contributes to the elastic properties of the fingers and thus of the clip. The geometry shows straight finger geometry for simple elongation.

For a finger protruding from the clip in straight lead geometry, as depicted by finger 431 of FIG. 4, an outside force, applied along the length of the finger 431, stretches the finger in the direction of the length, while the dimension of the width is only slightly reduced, so that the new shape appears slightly elongated. For elongations small (i.e. less than 8% for copper) compared to the length, and up to a limit, called the elastic limit given by the material characteristics, the amount of elongation is linearly proportional to the force. Beyond that elastic limit, the finger or its fixture, the solder connection, would suffer irreversible changes and damage. FIG. 4 indicates the elongation-only approach. Tip 431c of finger 431 is attached to the solder connection. The solid line represents the finger configuration at ambient temperature. At elevated temperatures, the substrate expands due to its high CTE and exerts force aiming at elongating finger 431 by a small fraction designated 431d. Finger 431 has the freedom to behave like a spring. The amount of extension increases with the length of a free finger. Consequently, the elongated fingers of the embodiment of FIG. 3B provide more spring-like behavior.

Figure 5:
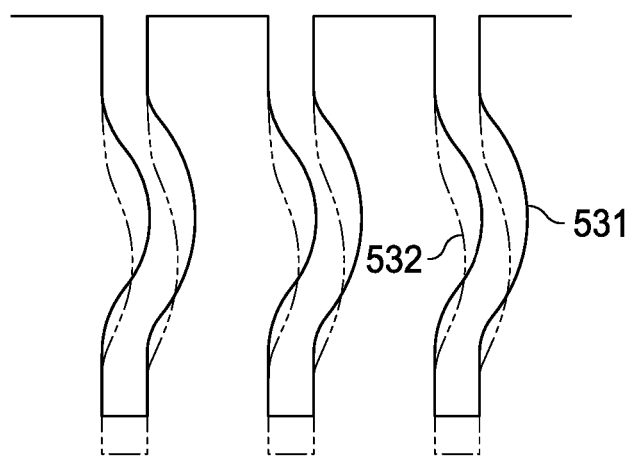
FIG. 5 illustrates another example of a geometry for the ridge fingers of a clip, which contributes to the elastic bending and stretching properties beyond the limit of simple elongation based upon inherent lead material characteristics. The example is based on curved finger geometry.

The elongation-only approach of the fingers in FIG. 4 can be made more effective, when the finger design includes bendings so that a pulling force can stretch and linearize the fingers. As depicted in the exemplary embodiment of FIG. 5, a contribution by linearizing fingers (532) can be obtained when a topologically long finger is first designed to contain curves, bendings and meanderings 531. By applying force, at least part of the non-linearities is stretched or straightened so that afterwards the body is elongated. The fingers have a geometry to accommodate, under a force lying in the plane of the substrate, elastic bending and stretching beyond the limit of simple elongation based upon inherent material characteristics. When attached to a horizontal substrate with high CTE, such as a copper lead, the fingers are suitable to act as spring-like compliant cantilevers.

The characteristics of elastic elongation and elastic stretching of the metallic fingers remain effective even after encapsulating the converter including the top clip in a plastic packaging compound. The effectiveness is based on the high modulus of the metallic fingers (for instance made of copper) relative to the low modulus of the polymerized packaging material (for instance polymerized epoxy compound); the modulus being the ratio of stress divided by strain.

Figure 6:
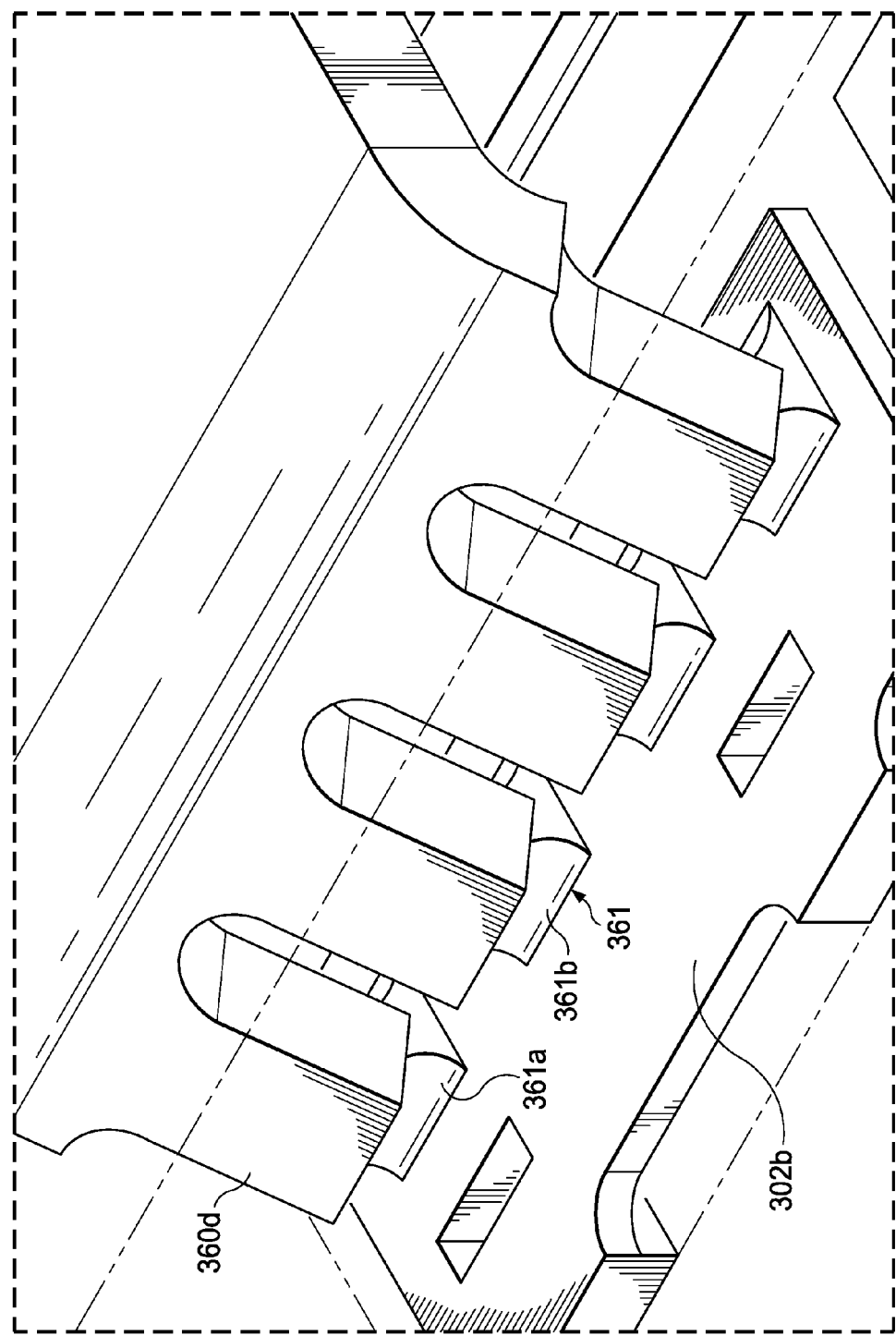
FIG. 6 shows an enlargement of the fingers of the embodiment in FIG. 3A, emphasizing the discrete attachment for segmented joints.

FIG. 6 shows an enlargement of the short fingers 360d of the embodiment in FIG. 3A in order to emphasize the technical advantage of segmented joints. The contacts of the fingers 360d to the broad lead 302b are established by connecting material 361, which is preferably solder printed in discrete spots, but may alternatively be a conductive polymer or any other joint material. It is advantageous to deposit the connecting material 361 only in discrete spots 361a, 361b, etc., or alternatively, to render the lead solderable only in discrete spots for each individual finger 360d, for several reasons.

When connecting material 361 (e.g., solder), is deposited only in spots where it is needed to connect the fingers (e.g., copper) to the lead (e.g., copper), the contact areas between the solder fillet and the copper parts are kept small and the smaller geometry has to absorb less stress from thermal mismatch.

Since microcracks may propagate easily, as pointed out above, an eventual crack in one joint cannot propagate to other joints. Overall, the clip has a crack-arresting feature. The crack of a single finger may render the clip attachment to the lead as only "wounded", but will not become apparent as a complete failure (electrical open).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium nitride, gallium arsenide, or any other semiconductor or compound material used in integrated circuit manufacturing.

As another example, the invention applies not only to field effect transistors, but also to other suitable power transistors, to bipolar transistors, insulated gate transistors, thyristors, and others.

As another example, the invention applies not only to metallic clips with ridges bent relative to plates, but also to flat clips. The finger structure of the clip foot can offer elongations and stretchings for absorbing thermomechanical stress.

It is therefore intended that the appended claims encompass any such modifications or embodiment.

I claim:

1. A power converter comprising:
    a first transistor chip conductively stacked on top of a second transistor chip attached to a substrate; and
    a first metallic clip having a plate portion and a ridge portion bent at an angle from the plate portion;
        the plate portion attached to the terminal of the first transistor chip opposite the second transistor chip;
        the ridge portion extended to the substrate and configured as a plurality of parallel straight fingers; and
    each finger discretely attached to the substrate and operable as a spring-line cantilever to accommodate, under a force lying in the plane of the substrate, elastic elongation based upon inherent material characteristics.

2. The converter of claim 1 further including a second metallic clip soldered to the first transistor chip on a first surface and to the second transistor chip on a second surface opposite the first surface.

3. The converter of claim 2 wherein the substrate is selected from a group including metallic leadframes and laminated substrates.

4. The converter of claim 3 wherein the attachments comprise a material selected from a group including solder alloys and conductive adhesives.

5. The converter of claim 4 wherein the first transistor is a MOS FET having a drain terminal soldered to the first metallic clip.

6. The converter of claim 5 wherein the first transistor further has a source terminal soldered to the second metallic clip.

7. The converter of claim 6 wherein the second transistor is a MOS FET having a drain terminal soldered to the second metallic clip.

8. The converter of claim 7 wherein the second transistor has a source terminal soldered to the substrate.

9. A power converter comprising:
- a first transistor chip conductively stacked on top of a second transistor chip attached to a substrate; and
- a first metallic clip having a plate portion and a ridge portion bent at an angle from the plate portion;
  - the plate portion attached to the terminal of the first transistor chip opposite the second transistor chip;
  - the ridge portion extended to the substrate and configured as a plurality of fingers having a geometry to accommodate elongation in a direction substantially in the plane of the ridge portion; and
- each finger discretely attached to the substrate and operable as a spring-line cantilever to accommodate, under a force lying in the plane of the substrate, elastic stretching beyond elongation based upon inherent material characteristics.

10. The converter of claim 9 further including a second metallic clip soldered to the first transistor chip on a first surface and to the second transistor chip on a second surface opposite the first surface.

11. The converter of claim 10 wherein the first transistor is a MOS FET having a drain terminal soldered to the first metallic clip.

12. The converter of claim 11 wherein the first transistor further has a source terminal soldered to the second metallic clip.

13. The converter of claim 12 wherein the second transistor is a MOS FET having a drain terminal soldered to the second metallic clip.

14. The converter of claim 13 wherein the second transistor has a source terminal soldered to the substrate.

15. The converter of claim 14 wherein the fingers of the ridge portion have a geometry selected from a group including curved geometry, bending geometry, and toroidal geometry.

* * * * *